Figure 1:
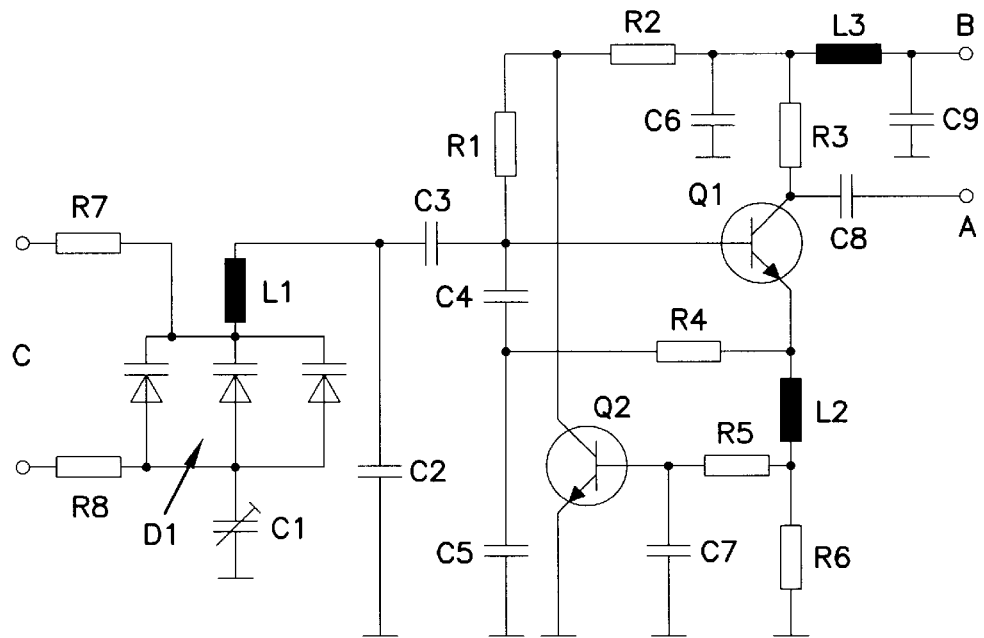

United States Patent
Hagemeyer

[11] Patent Number: 5,900,788
[45] Date of Patent: May 4, 1999

[54] LOW-NOISE OSCILLATOR CIRCUIT HAVING NEGATIVE FEEDBACK

[75] Inventor: Frank Hagemeyer, Wedemark, Germany

[73] Assignee: Sennheiser Electronic GMBH & Co. KG, Wedemark, Germany

[21] Appl. No.: 08/989,084

[22] Filed: Dec. 11, 1997

[30] Foreign Application Priority Data

Dec. 14, 1996 [DE] Germany ............... 196 52 146

[51] Int. Cl.⁶ ............... H03B 5/12; H03C 3/22
[52] U.S. Cl. ............... 331/117 R; 331/117 V; 332/136
[58] Field of Search ............... 331/117 R, 117 FE, 331/117 D, 177 V; 332/135, 136

[56] References Cited

U.S. PATENT DOCUMENTS

| | | | |
|---|---|---|---|
| 3,374,445 | 3/1968 | Gaunt et al. | 331/109 |
| 3,609,580 | 9/1971 | Thompson et al. | 331/117 R |
| 3,832,653 | 8/1974 | Nugent et al. | 331/117 R |
| 3,852,686 | 12/1974 | Morii | 331/117 R |
| 4,158,182 | 6/1979 | Washburn | 331/117 R |

FOREIGN PATENT DOCUMENTS 2225502  5/1990  United Kingdom.

OTHER PUBLICATIONS

Prigent, M. and J. Obregon.: Phase Noise Reduction in FET Oscillators by Low–Frequency Loading and Feedback Circuitry Optimization. In: IEEE Transactions on Microwave Theory and Techniques, vol. MTT–35, No. 3, Mar. 1987, pp. 349–352.

*Primary Examiner*—Siegfried H. Grimm
*Attorney, Agent, or Firm*—Merchant, Gould, Smith, Edell, Welter & Schmidt, P.A.

[57] ABSTRACT

A low-noise oscillator circuit with an amplifier element for negative feedback, specifically a transistor. In addition to a positive feedback of the oscillator transistor, provision is made for a negative-feedback loop with a pass band of 0 (thus DC coupling) to $\frac{1}{4}$ to $\frac{1}{100}$ of the oscillation frequency of the oscillator, in order to regulate out fluctuations of the current of the amplifier element.

9 Claims, 1 Drawing Sheet

LOW-NOISE OSCILLATOR CIRCUIT HAVING NEGATIVE FEEDBACK

The invention concerns a low-noise oscillator circuit with an amplifier element connected for feedback, to which amplifier element a resonator, e.g. a resonant circuit, is coupled, in which oscillator circuit, in addition to a positive feedback of the amplifier for the oscillation generation, a negative feedback loop between the output and the input of the amplifier element is provided for. The amplifier element serves to compensate losses in the resonator and to provide the power to be coupled out.

The noise of an oscillator circuit is determined essentially through the active element, namely the transistor for the oscillation generation. The single-sideband noise power of an oscillator circuit, i.e. the phase noise of the oscillator, can be approximately calculated with the Leeson formula known from the literature. From this it follows that the noise is lower with higher power consumption, which, however, is a disadvantage in portable devices with battery power supplies.

The noise level of an oscillator under operating conditions typically lies at ca. 10–15 dB and is thus higher than the small-signal noise measurement of ca. 1–3 dB specified in data sheets. The cause of this lies in essence in the conversion from amplitude noise to phase noise.

Already known from GB-A-2 225 502 is an oscillator circuit with a transistor with feedback and a resonant circuit that shows a negative feedback for noise reduction. The negative feedback path, however, leads through a coupling capacitor that determines the lower limiting frequency of the negative feedback branch. If this coupling capacitor is designed too large, then this leads, to be sure, to a lower limiting frequency, but also has the consequence of a larger space requirement, which is a disadvantage with mobile devices. In addition, a large coupling capacitor leads to a long turn-on time of the oscillator circuit, i.e. the time that elapses after the switching-on of the operating voltage until the attaining of the final DC-voltage operating point. This switch-on time can amount to several minutes with the large capacitors that are necessary, during which time the oscillator circuit is not yet capable of operating.

Known from the U.S. Pat. No. 3,374,445 is an oscillator circuit with two positive-feedback paths, which are provided for in order to achieve lower distortion levels but which do not improve the noise behavior of the oscillator. Finally, the U.S. Pat. No. 4,158,182 as well as an article in *IEEE Transaction on Microwave Theory and Techniques*, Vol. MTT-35. No. 3, March 1987, pages 349–352 show additional oscillator circuits, which, however, are constructed in a different manner than the circuit arrangement according to the present invention.

The invention has as its basis the task of producing a simple, low-noise oscillator circuit that distinguishes itself through an operating-power requirement that for practical purposes is not increased.

This task is accomplished according to the present invention by the fact that the pass band of the negative-feedback loop is fixed by means of a low-pass filter to a pass band of 0 (DC) to ¼–¹⁄₁₀₀ of the oscillator frequency.

What is achieved through this measure is that the amplitude fluctuations of the amplifier element are eliminated through this negative feedback down to a frequency of 0, i.e. DC, so that the phase noise is greatly reduced. By the fact that the pass band begins already at 0, i.e. DC coupling is present, the operating point of the oscillator circuit is stabilized at the same time. To be sure, such operating-point stabilization through DC coupling is in itself already known, but not negative feedback with a pass band to higher frequencies for the purpose of noise suppression.

The oscillator circuit according to the invention is preferably a frequency-modulated oscillator that has a frequency-fixing resonant circuit with variable capacitance diodes.

The invention is described in the following with the aid of two implementation examples, reference being made to the drawings.

Figure 2:
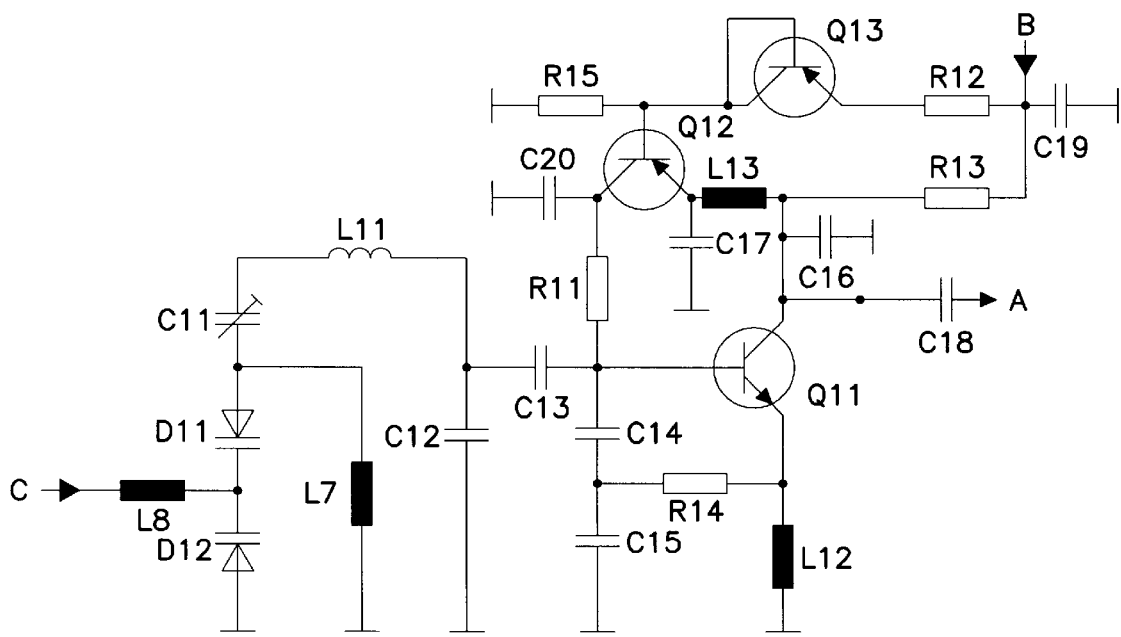

FIG. 1 shows a first advantageous implementation form of the present invention, and FIG. 2 shows a second implementation form In the oscillator circuit according to FIG. 1 the transistor Q1 serves as the oscillator transistor, which has in the emitter circuit an inductor L2 and in the collector circuit a collector resistance R3. The generated high frequency is coupled out via a capacitor C8 to an output A. The collector circuit is connected to an operating voltage B via a filter member C6, L3, and C9. The base of the transistor Q1 obtains a base current via series resistances R1, R2, the value of which base current is regulated by a negative feedback loop in such a manner that the operating point of the transistor Q1 is fixed.

A resonant circuit (resonator) consists of an inductor L1, variable capacitance diodes D1, a variable capacitor C1, as well as further fixed capacitors C2, C3, C4, and C5, with the latter serving as a capacitive voltage divider, in order to achieve a positive feedback of the oscillator via a feedback resistance R4.

The variable capacitance diodes D1 consist in the present case of three parallel-connected variable capacitance diodes. in order to reduce the diode noise in a known manner. Via resistances R7 and R8 a tuning voltage is coupled in at C, in order to vary the frequency of the oscillator. It is also possible to supply a modulation voltage for frequency modulation.

The circuit particulars described to this point are essentially conventional. In series with the inductor L2 located in the emitter circuit, a further resistance R6 is provided for developing a voltage drop proportional to the emitter current. In large-signal operation the emitter current has superimposed on it strong noise components whose spectrum extends practically from zero into the MHz region. This noise spectrum is modulated onto the oscillator signal, and noise side-bands appear in the oscillator output signal.

The emitter current flowing through the resistance R6 generates a voltage drop of approximately 0.7 V with superimposed noise voltage. This voltage is used as the control voltage of a negative-feedback loop for the base circuit of the transistor Q1, that is, it is led via a low-pass member R5, C7 to the base of an additional transistor Q2. Whereas the emitter of this transistor Q2 is grounded, the collector is connected to the connection point between the resistances R1 and R2, so that the amplified voltage is fed back in opposite phase to the base of the transistor Q1 via the resistance R1.

It has been determined that through this negative feedback of noise a strong reduction of the noise voltage is seen at the output of the oscillator, namely. the reduction is up to 15 dB.

The negative-feedback loop from the emitter of the transistor Q1 via the transistor Q2 to the base of transistor Q1 contains, as already mentioned, the low-pass member R5, C7. The capacitor C7 is relatively small, so that for the most part no special capacitor must be provided for, but rather the input capacance of transistor Q2 is sufficient.

Furthermore, the inductance L2 and R3 form an additional low-pass member, and finally the resistance R1, together with the capacitors and capacitances connected to the base of transistor Q1, forms a further low-pass member. In the present example. where the oscillator circuit is designed for a frequency of 170 MHz, the limiting frequencies of the three low-pass members, i.e. L2/R6, R5/C7, and R1 with the input capacitance of transistor Q1, lie at approximately 10 MHz.

The limiting frequency of the collective low-pass filtering thus lies sufficiently far away from the oscillator frequency, and appropriate values for the pass band of the low-pass filtering lie from 0 to ¼–¹⁄₁₀₀, preferably ¹⁄₁₀–¹⁄₁₀₀, of the oscillator frequency. Since a DC negative feedback is present, not only does the effectiveness begin at frequency zero, but also the operating point of the transistor Q1 of the oscillator is at the same time stabilized, so that the dependence of the oscillator frequency on the operating voltage is improved.

The supplying of the base voltage for transistor Q1 can take place without problem via a resistance, here R1, since the noise voltages generated in this resistance are regulated out by the control loop. The usual expensive choke employed in conventional circuits can be omitted.

Through the insertion of the negative-feedback transistor Q2 the DC power consumption is only negligibly increased, since only the base-current requirement of the oscillator transistor Q1 is controlled.

FIG. 2 shows a second advantageous implementation form of the present invention, in which implementation the negative-feedback branch, in contrast to the first implementation form according to FIG. 1, leads from the collector of the oscillator transistor via an additional amplifier members to the base.

In FIG. 2 the transistor Q11 serves as the oscillator transistor, which has an inductance L12 in the emitter circuit and a collector resistance R13 in the collector circuit, which collector resistance is connected to an operating voltage B. The operating voltage B is blocked by a capacitor C19. The high frequency generated is coupled out to the output A via a capacitor C18. The base of the transistor Q11 obtains a base current via a resistance R11, a second transistor Q12, and a third transistor Q13 connected as a diode, as well as a series resistance R12.

A resonator circuit (resonator) consists of an inductor L11, a variable capacitor C11, two variable capacitance diodes D11 and D12, as well as additional fixed capacitors C12, C13, C14, and C15, with C14 and C15 serving as a capacitive voltage distributor, in order to achieve a positive feedback of the oscillator via a feedback resistance R14. Via chokes L7 and L8 the variable capacitance diodes D11 and D12 receive a tuning voltage at the input C, in order to vary the frequency of the oscillator. It is also possible to superimpose a modulation voltage on this tuning voltage for frequency modulation.

The further design elements of the circuit arrangement according to FIG. 2 are essentially of a conventional nature, such as a voltage-distributor resistance R15 and a filter capacitor C20, for example.

The negative-feedback voltage fed back for the purpose of noise reduction is produced at the collector of the transistor Q11, thus at the collector resistance R13. This negative-feedback voltage reaches the emitter of an amplification transistor Q12 via an inductor L13, and the amplified negative-feedback voltage is produced at the collector of the transistor Q12 and reaches the base of the oscillator transistor Q11 via the resistance R11.

This second circuit arrangement has, with respect to the first implementation form according to FIG. 1, the advantage that is has a lower operating voltage requirement. Only about 0.4 V voltage drop at the collector resistance R13 is required from the operating voltage at the capacitor C19 for the negative-feedback and the operating-point setting. Thus, in the interest of the best noise reduction, almost all of the total operating voltage (in the present case about 2.6 V of the 3 V total operating voltage) is available for the oscillator transistor Q11. The phase noise of this circuit was measured at 88 dBc at 1 kHz frequency separation with an oscillator frequency of 600 MHz.

In the present implementation examples the transistor Q1 or Q11, respectively, serves as the amplifier element for the oscillator circuit. The inventive principle can, however, be applied with other amplifier elements, for example with tube circuits. It is even possible to apply the inventive principle in conjunction with active two-terminal devices with negative resistance characteristics.

Likewise, in place of an LC resonant circuit a different resonator can be used, for example a quartz oscillator or a lead. Also, the present feedback transistor circuit with the transistor Q1 or Q11, respectively, can be viewed as a two-terminal device.

I claim:

1. Low-noise oscillator circuit with an amplifier element connected for feedback, to which amplifier element a resonator, e.g. a resonant circuit, is coupled, in which oscillator circuit, in addition to a positive feedback of the amplifier for the oscillation generation, a negative feedback loop between the output and the input of the amplifier element is provided for, characterized hereby, that the pass band of the negative-feedback loop (R5, C7, Q2, R1; L13, C17, Q12, C20, R11) is set at a pass band from 0 (DC) to ¼–¹⁄₁₀₀ of the oscillator frequency by means of a low-pass filter (L2/R6, R5/C7, R1/C4/C5 . . . ; L13/C17, C20/R11/C14/C15 . . . ).

2. Oscillator circuit according to claim 1, characterized hereby, that the pass band of the negative-feedback loop (R5, C7, Q2, R1; L13, C17, Q12, C20, R11) is set at 0 (DC) to ¹⁄₁₀–¹⁄₁₀₀ of the oscillator frequency.

3. Oscillator circuit according to claim 1, characterized through a transistor (Q1; Q11) as amplifier element for the oscillation generation.

4. Oscillator circuit according to claim 3, characterized hereby, that provision is made for the negative-feedback loop (R5, C7, Q2, R1) between the emitter and the base of the transistor (Q1), and for an additional transistor (Q2) in the negative-feedback loop (R5, C7, Q2, R1).

5. Oscillator circuit according to claim 4, characterized hereby, that the base of the additional transistor (Q2) is connected to the emitter, and the collector to the base, of the transistor (Q1) serving for the oscillation generation.

6. Oscillator circuit according to claim 3, characterized hereby, that provision is made for the negative-feedback loop (L13/C17; C20/R11/C14/C15 . . . ) between the collector and the base of the transistor (Q11), and for an additional transistor (Q12) in the negative-feedback loop.

7. Oscillator circuit according to claim 6, characterized hereby, that the emitter of the additional transistor (Q12) is connected to the collector, and the collector to the base, of the transistor (Q11) serving for the oscillation generation.

8. Oscillator circuit according to claim 7, characterized hereby, that the base of the additional transistor (Q12) is biased by means of a further transistor (Q13) connected as a diode.

9. Oscillator circuit according to claim 1, characterized hereby, that the oscillator is a frequency-modulated oscillator that has a fixed-frequency resonant circuit with variable capacitance diodes (D1; D11, D12).

* * * * *